United States Patent
Rudolph et al.

(10) Patent No.: US 11,855,522 B2
(45) Date of Patent: Dec. 26, 2023

(54) METHOD AND DEVICE FOR CONTROLLING AN ELECTRONIC CONVERTER IN A TECHNICAL SYSTEM USING METHODS OF ARTIFICIAL INTELLIGENCE

(71) Applicant: Robert Bosch GmbH, Stuttgart (DE)

(72) Inventors: Maja Rita Rudolph, Tuebingen (DE); Dennis Bura, Renningen (DE); Samuel Vasconcelos Araujo, Esslingen am Necker (DE); Michael Jiptner, Renningen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 17/402,056

(22) Filed: Aug. 13, 2021

(65) Prior Publication Data
US 2022/0069694 A1  Mar. 3, 2022

(30) Foreign Application Priority Data
Aug. 27, 2020 (DE) .............. 10 2020 210 826.9

(51) Int. Cl.
*H02M 1/08* (2006.01)
*H02M 1/00* (2006.01)
*G06F 1/28* (2006.01)

(52) U.S. Cl.
CPC ....... *H02M 1/0012* (2021.05); *H02M 1/0006* (2021.05); *H02M 1/08* (2013.01);
(Continued)

(58) Field of Classification Search
CPC ............. H02M 1/0012; H02M 1/0006; H02M 1/0048; H02M 1/0054; H02M 1/32;
(Continued)

(56) References Cited

U.S. PATENT DOCUMENTS 8,698,469 B1 *  4/2014  Latham, II ............. H02M 1/15
                                                323/283
8,901,899 B1 * 12/2014  Kiadeh ............... H02M 3/1588
                                                323/285

(Continued)

OTHER PUBLICATIONS

Bordons, C. et al., "Basic Principles of MPC for Power Converters," IEEE Industrial Electronics Magazine, Sep. 2015, pp. 31-43 (13 pages).

(Continued)

*Primary Examiner* — Thienvu V Tran
*Assistant Examiner* — Shahzeb K Ahmad
(74) *Attorney, Agent, or Firm* — Maginot, Moore & Beck LLP

(57) ABSTRACT

A method is disclosed for operating a technical apparatus with an electronic converter controlled a control signal. A control signal profile is provided with which the electronic converter is to be operated. A predicted control signal profile is predicted based on the provided control signal profile. The predicted control signal profile is a predicted future profile of the control signal. A modified control signal profile of is obtained by modifying the provided control signal profile using a trainable, data-based control signal model. The control signal model is trained to determine the modified control signal profile based on the provided control signal profile and the predicted control signal profile. The electronic converter is operated using the modified control signal profile.

20 Claims, 4 Drawing Sheets

(52) U.S. Cl.
CPC .............. *G06F 1/28* (2013.01); *H02M 1/0048* (2021.05); *H02M 1/0054* (2021.05)

(58) Field of Classification Search
CPC ........ H02M 1/327; H02M 1/08; H02M 3/156; H02M 3/335; H02M 7/04; H02M 7/155; H02M 7/1555; H02M 7/162; H02M 7/1623; H02M 7/21; H02M 7/217; H02M 7/219; H02M 1/088; H02M 1/34; H02M 1/0003; H02M 1/0025; H03K 17/166; G05B 19/0423; G05B 2219/25257; G06F 1/28; G05F 1/46; G05F 1/565; G05F 1/575
See application file for complete search history.

(56) References Cited

U.S. PATENT DOCUMENTS

| | | | |
|---|---|---|---|
| 2020/0195145 A1* | 6/2020 | Schwabe | H02M 3/1584 |
| 2020/0313569 A1* | 10/2020 | Hall | G05B 13/0265 |
| 2022/0083114 A1* | 3/2022 | Schwabe | H02M 1/0025 |
| 2022/0413450 A1* | 12/2022 | Watanabe | H02M 3/157 |

OTHER PUBLICATIONS

Saadatmand, S. et al., "The Voltage Regulation of a Buck Converter Using a Neural Network Predictive Controller," IEEE, 2020 (6 pages).

Dragicevic, T. et al., "Weighting Factor Design in Model Predictive Control of Power Electronic Converters: An Artificial Neural Network Approach," IEEE Transactions on Industrial Electronics, Nov. 2019, vol. 66, No. 11, pp. 8870-8880 (11 pages).

Rivera, M. et al., "A Comparative Assessment of Model Predictive Current Control and Space Vector Modulation in a Direct Matrix Converter," Feb. 2013, IEEE Transactions on Industrial Electronics, vol. 60, Iss. 2, pp. 578-588 (11 pages).

* cited by examiner

_US 11,855,522 B2_

METHOD AND DEVICE FOR CONTROLLING AN ELECTRONIC CONVERTER IN A TECHNICAL SYSTEM USING METHODS OF ARTIFICIAL INTELLIGENCE

This application claims priority under 35 U.S.C. § 119 to application no. DE 10 2020 210 826.9, filed on Aug. 27, 2020 in Germany, the disclosure of which is incorporated herein by reference in its entirety.

TECHNICAL FIELD

The disclosure relates to the control of electronic converters in a technical system using a control signal. The present disclosure relates in particular to measures for adapting the control signal in order to achieve improved operating properties of the technical system.

BACKGROUND

Electronic converters are electronic circuits that with one or a plurality of converter components that comprise, for example, transistors, MOSFETs, IGBTs or the like, in order to provide a defined electrical variable for operating a technical system such as an electrical machine.

Electronic converters are operated using a control signal that is applied to a base or gate terminal of one or a plurality of active converter components. In many applications, control signals for various events follow in each case sequences with a fixed definition, and often serve to perform transitions from a blocking state into a conductive state in a defined manner.

The control signals are generated by a control unit or another driver unit. These signals frequently have stepped or ramped profiles in order to achieve the desired switching or transmission behavior of the converter component.

The operation of such a converter, such as in an electrical traction system of a motor vehicle, has an influence on operating states of the traction system. Operating properties can thus include the range of the vehicle and a degree of aging of the components such as the traction battery, the electronic converter and the traction motor.

SUMMARY

According to the disclosure, a method for operating a technical apparatus with an electronic converter controlled by at least one control signal and a device and a technical system as claimed in the subsidiary claims are provided.

Further configurations are given in the disclosed embodiments.

According to a first aspect, a method for operating a technical apparatus with an electronic converter controlled by a control signal is provided, having the following steps:
  providing a control signal profile with which the electronic converter is to be operated,
  predicting a predicted control signal profile depending on the provided control signal profile as a predicted future profile of the control signal;
  modifying the provided control signal profile according to a trainable, data-based control signal model depending on the provided control signal profile and depending on the predicted control signal profile in order to obtain a modified control signal profile,
  wherein the control signal model is trained to determine the modified control signal profile depending on the provided control signal profile and on the predicted control signal profile;
  operating the electronic converter in accordance with the modified control signal profile.

Electronic systems usually comprise converters that are part of an electronic circuit or that operate said circuit. Such a converter, in particular a converter component, such as an active electronic component of the converter, is driven by a sequence of control signal values of a control signal profile that is provided by a control unit. Sequences of control signal values of a control signal profile are referred to herein as control signal time sequences. For reasons of processing of the signals more easily, the control signal time sequences are assumed to be time-discrete. The converter can, furthermore, also be driven by more than one control signal profile in the same or a different manner.

The control signal profile or the control signal time sequence for operating the converter can have state transitions or state profiles, in particular potential changes or current changes in the form of edges or ramps that cause a corresponding reaction in the downstream electronic circuit. In the case of an electronic converter, the control signal time sequence can comprise state transitions or state profiles, in particular potential changes or current changes in the form of edges or ramps that exhibit a periodicity and that cause a corresponding reaction in a technical apparatus connected thereto.

The control signal profile, in particular the form of state transitions (voltage step, voltage ramp etc.), can significantly determine the behavior of the converter and of a technical apparatus operated thereby. For example, power losses and malfunctions of the technical apparatus, the service life of the system, as well as stresses on the converter component or on the electronic converter, can be significantly determined by the temporal profile of the states, the state transitions and/or the state profile of the control signal profile or of the control signal time sequence.

According to the above method, provision is made for a data-based control signal model to be provided in order to optimize the form (temporal profile) of the control signal profile for the operation of the electronic converter. The control signal model is trained so that, depending on the provided control signal profile, i.e. on the control signal time sequence, and depending on a predicted control signal profile, i.e. on a predicted control signal time sequence that predicts the provided control signal profile, a modified control signal profile is generated for the operation of the converter component and, finally, of the technical apparatus. The optimized/modified control signal profile is optimized here with reference to a long-term predicted behavior of the technical apparatus.

The control signal model can furthermore be designed to determine further the modified control signal profile depending on one or more of the following variables: one or a plurality of operating variables of the electronic converter and/or of the technical apparatus to be operated, one or a plurality of operating properties of the electronic converter and/or of the technical apparatus to be operated, one or a plurality of system properties of the electronic converter and/or of the technical apparatus to be operated, and one or a plurality of system variables of the technical apparatus.

Operating variables can here affect the operation of the technical apparatus, and in particular comprise one or a plurality of the following parameters: a thermal resistance of the overall construction, a capacitance of a smoothing capacitor that is coupled to the electronic component, and variances of these variables.

It can be provided that the control signal model is designed as a trainable, data-based model, in particular as an artificial neural network, such as a multi-layer perceptron, or a recursive neural network.

The provided control signal profile can be further parameterized or defined for operating the electronic converter and the predicted control signal profile can be parameterized or defined by control signal parameters, and/or the modified control signal profile can be parameterized or defined by appropriate modified control signal parameters.

In particular, the parameterization of the provided control signal profile and/or of the modified control signal profile can be carried out using time segments and values, assigned to the time segments, of an electrical variable, in particular of a voltage or of a current.

Alternatively, the parameterization of the provided control signal profile and/or of the modified control signal profile can be carried out by one or more parameters of a periodic actuation, in particular a cycle frequency of a periodic actuation, in particular a frequency modulation and/or pulse-width modulation, a modulation depth, a duty ratio, a pulse duration and/or a pulse shape.

According to one embodiment, the prediction of the predicted control signal profile can be carried out using a data-based prediction model that is trained to ascertain the predicted control signal profile depending on the provided control signal profile, wherein the data-based prediction model comprises in particular a recurrent neural network, a state-space model, a Sequence2Sequence model or a NARXGP model.

The modification of the provided control signal time sequence can be carried out according to the trainable, data-based control signal model, depending on the profile of the at least one original control signal and depending on the future profile of the at least one original control signal, and also depending on one or a plurality of operating variables that indicate a state of the technical apparatus to be controlled.

The modification of the provided control signal profile according to the trainable, data-based control signal model can also be carried out depending on the provided control signal profile and depending on the predicted control signal profile, and also depending on one or a plurality of operating variables of the technical apparatus that indicate a state of the technical apparatus to be controlled, in particular depending on the predicted control signal profile.

According to a further aspect, a method for training a control signal model, in particular for use in the above method, wherein the control signal model is designed to determine a modified control signal profile depending on a provided control signal profile and depending on a predicted control signal profile based on the provided control signal profile, is with the following steps:
  providing training data sets that each comprise the provided control signal profile, with which the electronic converter (2) is to be operated, and the predicted control signal profile;
  training the control signal model depending on a loss function, so that the provided control signal profile and the predicted control signal profile are mapped onto the modified control signal profile; wherein the loss function depends on one or a plurality of behavior measures of the technical apparatus when operating the converter with the predicted control signal profile.

The one or the plurality of behavior measures can furthermore each characterize a property of the technical apparatus depending on one or a plurality of behavior variables that indicate the behavior of the electronic circuit depending on the modified control signal profile, wherein, in particular, the respective behavior measure is determined according to a predefined cost function for evaluating behavior variables.

It can be provided that the behavior variables are ascertained using a measurement and/or a circuit simulation.

The control signal model can, in particular, be designed as a trainable, data-based model, in particular as an artificial neural network, such as a multi-layer perceptron, or a recursive neural network.

The loss function can, furthermore, depend on a weighted average of the behavior measures.

The cost function can map a plurality of behavior variables onto the behavior measure and, in particular, be differentiable, so that the loss function, in combination with a gradient-based training method, can be used for training the control signal model. The loss function can, in particular, depend on an overall behavior measure that takes the behavior measures of the individual time steps of the modified control signal profile into consideration.

It can be provided that the one or the plurality of behavior variables indicate a performance capability of the technical apparatus when driven by the modified control signal profile, wherein, in particular, the one or the plurality of behavior variables indicate a power loss, a measure of disturbance, in particular a measure relating to the occurrence of oscillations or of overshoots, an in particular thermal stress on the technical apparatus and/or a measure of stress affecting a service life to be expected of the converter component or of the technical apparatus.

For training the data-based control signal model, the behavior of the technical apparatus can be simulated using a circuit simulation tool such as SPICE, a circuit simulation, or with the (differential) equations that model the system behavior, and, using the behavior measure, the resulting response signals in the technical apparatus or the effect or the impact of the application of the control signal time sequence to the converter component can be evaluated in accordance with evaluation criteria (cost function). Thus, for example, power losses that correspond, for example, to the required switching energy, disturbances such as oscillations as a step response to the state transition of the control signal, as well as stresses on the converter component or on the overall system that can impair the service life such as temporary over-voltages or over-currents, as well as high temperatures resulting from a high level of heat development, can be evaluated for a predefined modified control signal time sequence.

The behavior measure can be provided using the cost function to optimize the operating behavior. One or a plurality of the criteria for the behavior of the electronic system can be evaluated here and, in particular, be mapped onto the behavior measure by way of a (differentiable) cost function. To train the data-based control signal model, the behavior measures over the time steps of the modified control signal time sequence are used. An optimized/modified behavior measure of the modified control signal time sequence (provided by the control signal model) is used here for training the data-based control signal model, in that the resulting loss function, which represents an overall behavior measure as a function of the control signal time sequence modified over the time steps, is taken into consideration or used.

To carry out the training of the data-based control signal model on the basis of a behavior measure based on a circuit simulation, the cost function for ascertaining the behavior measures, the loss function that combines the behavior measures with one another, and the model equations of the circuit simulation must be automatically differentiable. The calculation of the behavior measure on the basis of the original and modified control signals can thereby be combined directly with other elements of the control signal model. Since, for the training, the model equations of the circuit simulation (e.g. simulation tool, in particular SPICE, or differential equations that describe the system behavior), the cost function and the loss function are differentiable, the model parameters of the data-based control signal model can be trained directly with gradient-based methods (such as back propagation).

According to a further aspect, a device for operating a technical apparatus with an electronic converter controlled by at least one control signal is provided, wherein the device is designed to:

provide a control signal profile with which the electronic converter is to be operated, predict a predicted control signal profile depending on the provided control signal profile as a predicted future profile of the control signal;

modify the provided control signal profile according to a trainable, data-based control signal model depending on the provided control signal profile and depending on the predicted control signal profile in order to obtain a modified control signal profile, wherein the control signal model is trained to determine the modified control signal profile depending on the provided control signal profile and on the predicted control signal profile;

operate the electronic converter in accordance with the modified control signal profile.

According to a further aspect, a device for training a control signal model, in particular for use in the above method, is provided, wherein the control signal model is designed to determine a modified control signal profile depending on a provided control signal profile and depending on a predicted control signal profile based on the provided control signal profile; wherein the device is designed to:

provide training data sets that each comprise the provided control signal profile, with which the electronic converter is to be operated, and the predicted control signal profile;

train the control signal model depending on a loss function, so that the provided control signal profile and the predicted control signal profile are mapped onto the modified control signal profile; wherein the loss function depends on one or a plurality of behavior measures of the technical apparatus when operating the converter with the modified control signal profile.

According to a further aspect, an electronic system is provided with a technical apparatus that comprises a converter component of an electronic converter, and provided with the above device.

BRIEF DESCRIPTION OF THE DRAWINGS

Embodiments are explained below in more detail with reference to the appended drawings, in which.

DETAILED DESCRIPTION

Figure 1:
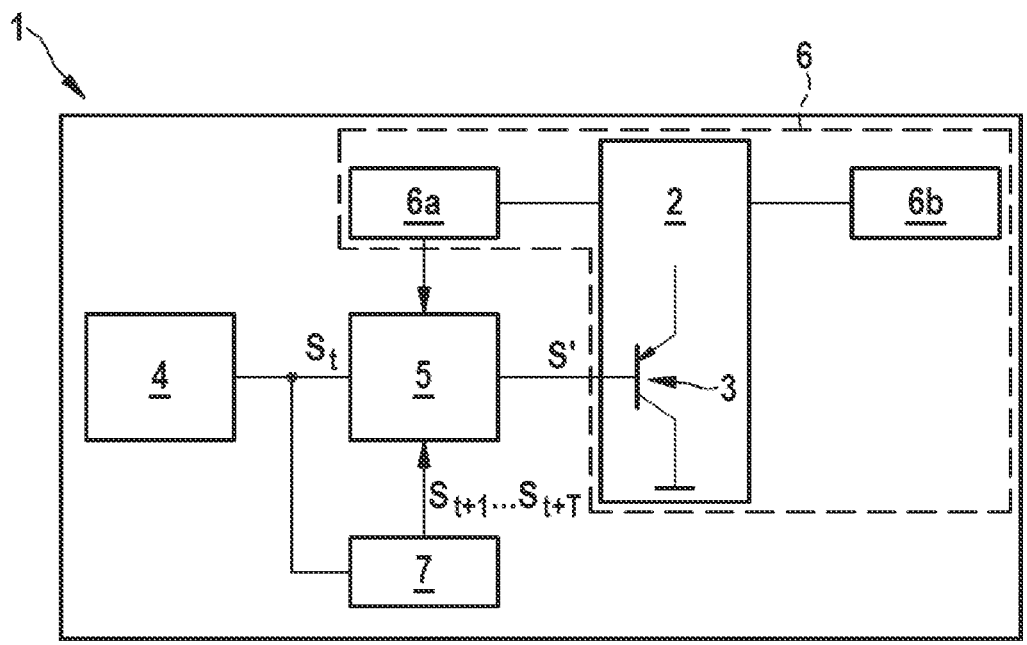
FIG. 1 shows a schematic illustration of an electronic system having a technical apparatus controlled by an electronic converter for operation with a modified control signal profile.

FIG. 1 shows a schematic illustration of a technical system 1 with an electronic converter 2 that comprises in any appropriate manner a converter component 3 here, by way of example, in the form of a transistor 3. The converter component 3 can be a bipolar transistor, a field-effect transistor, an IGBT, a MOSFET or the like. The electronic converter 2 can, for example, be designed as an inverter, in particular in the form of an H-bridge, B6 circuit or the like.

The converter component 3 is operated depending on a control signal S to carry out a function in the converter 2. A technical apparatus 6 that comprises the converter 2 can then be operated by this in a desired manner. The converter 2 can, for example, be a power converter for operating an electrical consumer (technical apparatus) such as a traction drive 6b of an electric vehicle that is driven by a vehicle battery 6a.

The control signal S is provided by a control unit 4 as a signal profile. The control signal S can be a current or voltage signal and to realize a desired function can be applied to a control input (base, gate) of the converter component 3. The control signal S is preferably provided in a time-discrete form as a control signal time sequence in the form of a temporal control signal profile of an electrical state, such as a voltage or a current, and can comprise state transitions or state profiles.

In addition, from the control signal time sequence S of a number of control signal values at sequential time steps, a predicted control signal time sequence $S_{t+1} \ldots S_{t+T}$ of control signal values at one or a plurality of time steps t up to a prediction horizon T can be estimated in a trainable, data-based prediction block 7. The predicted control signal time sequence $S_{t+1} \ldots S_{t+T}$ corresponds to a predicted control signal profile.

The prediction block 7 comprises a prediction model that can be designed as a recurrent neural network (LSTM, GRU), as a state-space model, as a Sequence2Sequence model or as an NARXGP model.

The prediction model can be trained in that for known time sequences of control signals S (provided control signal time sequences or provided control signal profile), one or a plurality of respectively chronologically next values (values for the next time step) of the control signal are predicted as the predicted control signal profile. The training takes place on the basis of conventional training methods (e.g. back propagation or other) with available control signal time sequences, wherein a loss function for the training of the prediction model indicates a difference between the predicted value and a known value for a respectively next time step of a provided control signal time sequence.

Using a control signal model block 5, the original control signal profile S provided by the control unit 4 is modified with a control signal model, depending on the predicted control signal profile $S_{t+1} \ldots S_{t+T}$, and is provided as a modified control signal profile S'.

The provided control signal profile, the predicted control signal profile and the modified control signal profile can each comprise the profiles of the control signal in a predefined time window. The predicted control signal profile can thus relate to a profile of the control signal for a predetermined period of time in the future, starting from a current evaluation time point. The modified control signal profile S' can accordingly relate to a predetermined further period of time in the future, starting from a current evaluation time point, which can be shorter than, longer than or equal to the time period of the predicted control signal. The provided control signal profile can relate to a control signal profile lying in the past up to a current evaluation time point.

The control signal model can also receive instantaneous operating variables of the technical apparatus 6 as further input variables such as a temperature of a component, the temperature of the cooling circuit, a power consumption, a current or voltage amplitude, the operating time until now and the like.

Figures 2A, 2B, 2C:
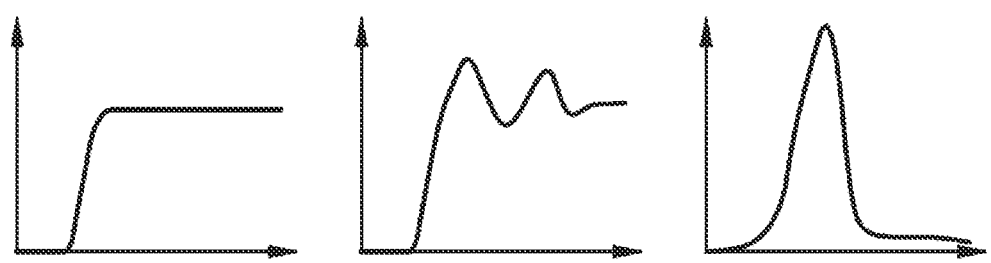
FIGS. 2A, 2B, and 2C show diagrams to illustrate signal responses of the electronic converter.

FIGS. 2B and 2C, for example, show signal profiles of a voltage or of a current of a resulting signal in the electronic converter 2 on the basis of a profile, shown in FIG. 2A, of a control signal S provided by the control unit 4. Various step responses (to a step in the control signal) that, on the one hand, exhibit a reverberation, an overshoot, an edge that is too flat and/or a current spike, are recognized.

The control signal model can be trained to optimize a behavior measure that evaluates a future behavior of the technical apparatus 6. The control signal model thus generates a modified control signal time sequence S' that is ascertained in response to a specified target.

Operation with the modified control signal time sequence S' can, for example, generate power losses on the basis of the switching energy consumed, which power losses depend on the dynamic properties of the control signal time sequence S, in the electronic converter 2. Stresses that can impair the service life of the technical apparatus 6 can also occur depending on the form of the profile of the control signal time sequence S on the electronic converter 2 or the electrical apparatus 6 controlled thereby. This can, for example, be brought about as a result of temporary over-voltages or of over-currents as well as of high temperatures that can accelerate aging of the converter component 3, of the converter 2 and/or of the technical apparatus 6.

The technical apparatus 6 can, for example, comprise an electric drive operated by a vehicle battery, wherein the operation can affect the aging of the vehicle battery as well as of the electric drive, along with the energy consumption or the efficiency.

The behavior of the technical apparatus 6 can be evaluated in accordance with various criteria and can be mapped onto a behavior measure in each time step that is ascertained from one or a plurality of behavior variables in accordance with a predefined cost function. Through variation of the form of the control signal time sequence, the one or the plurality of behavior variables, and thereby the assigned behavior measure, can change for every time step. The control signal time sequence in particular can be varied with the aim of improving a behavior of the electronic converter 2 and of the technical apparatus 6 in terms of long-term effects such as aging of components of the technical system 1.

The one or the plurality of behavior variables can comprise electrical variables, such as a current, a voltage, a power loss, an efficiency or the like, and can be ascertained through a circuit simulation, for example in the SPICE programming language, with which the response of the electronic converter 2 and of the technical apparatus 6 to the profile of an arbitrary control signal S can be determined. Response signals to the control signal S are to this end modelled/simulated/or measured in an experimental setup and are evaluated using one or a plurality of behavior variables according to one of the criteria (power loss, switching losses, measure of overshoot, loading etc.) mentioned above. A development of the temperature in the converter 2, for example, can thus be monitored. Since higher temperatures encourage the aging of components, an effect on the aging of the converter 2 can be obtained from a temporal profile of the temperature.

The ascertainment of the behavior variables depending on an applied control signal makes it possible to ascertain a behavior measure that indicates, for each time step under consideration, a quality of the operating behavior of the technical apparatus 6 in terms of a long-term criterion. The control signal model can thus be trained for the provision of a modified control signal profile with reference to a desired behavior of the technical apparatus. This can be indicated in a behavior measure using a suitable cost function on the basis of the behavior variables.

The cost function can, furthermore, be differentiable for combining the one or the plurality of behavior variables, in order to determine the behavior measure. The behavior measure characterizes the behavior of the technical apparatus 6, or of the entire technical system 1, in one time step with respect to a predefined criterion such as aging, energy efficiency or the like. The behavior measure can, for example, be calculated as a sum of the weighted behavior variables. The weightings can be predetermined according to an optimization criterion. Threshold values, for example, for temperatures, voltages or the like can be defined as criteria, so that the behavior measure is determined depending on a distance of the respective behavior variable from the respective threshold value.

The control signal model can be a data-based, trainable model, in particular an artificial neural network, or a regression model. An artificial neural network will be assumed as the model in the present case, since this can be trained easily using differentiation.

In order to process the provided control signal time sequence $S_t$ in the control signal model block 5, it must be parameterized in an appropriate manner. This can take place in the control unit 4 or, at the input, in the control signal model block 5. In the latter case, a provided, analog control signal can be sampled in order to provide this as a time-discrete control signal time sequence and parameterized in a suitable manner.

The control unit 4 can thus specify the control signal time sequence through sampled values at sequential time points or time steps.

Alternatively, the control unit 4 can specify the one or the plurality of original control signals S through time segments and values, assigned to the time segments, of an electrical variable, in particular of a voltage or of a current.

Figure 3:
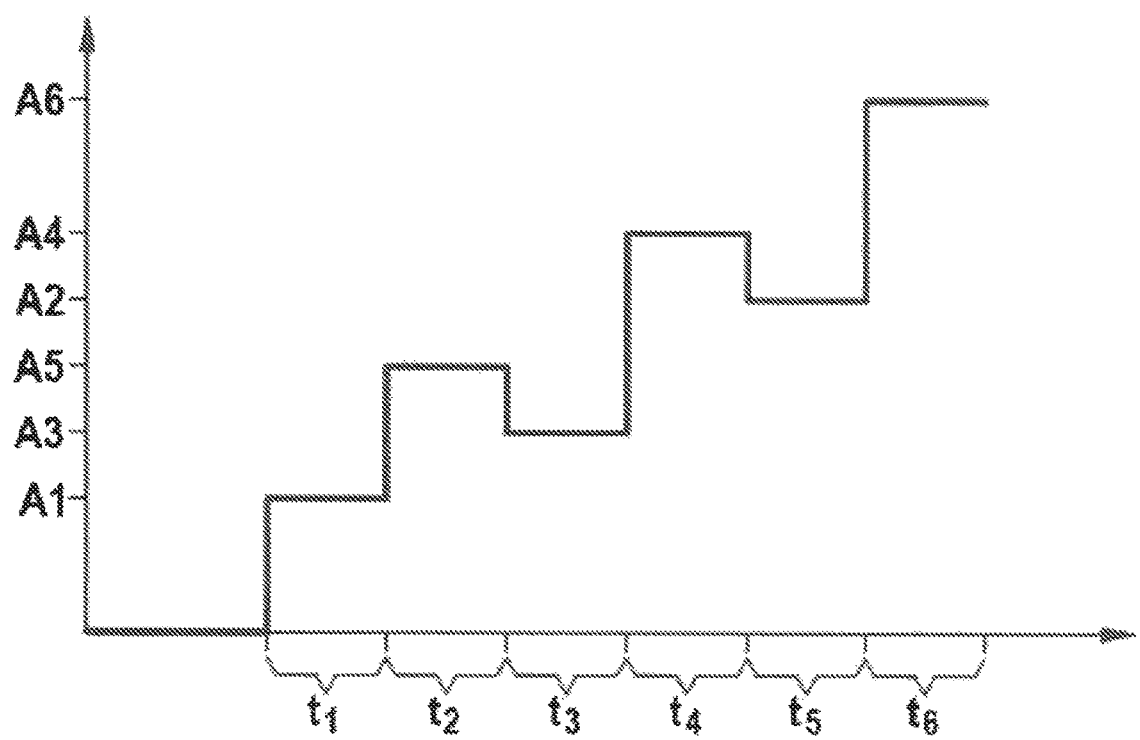
FIG. 3 shows a possibility for parameterization of the control signal.

The control signal S, as illustrated by way of example in FIG. 3, can thus be defined in multiple time intervals/time steps with different time durations t1, t2, . . . tn and with respective amplitudes A1, A2, . . . , An. The modified or optimized control signal profile S' to be ascertained by the control signal model can be parameterized in the same way or in a different way.

Alternatively, the control unit 4 can also indicate the one or the plurality of control signals by one or a plurality of parameters of a periodic actuation, such as a cycle frequency of a periodic actuation, in particular a frequency modulation and/or pulse-width modulation, a modulation depth, a duty ratio, a pulse duration and/or a pulse shape.

Figure 4:
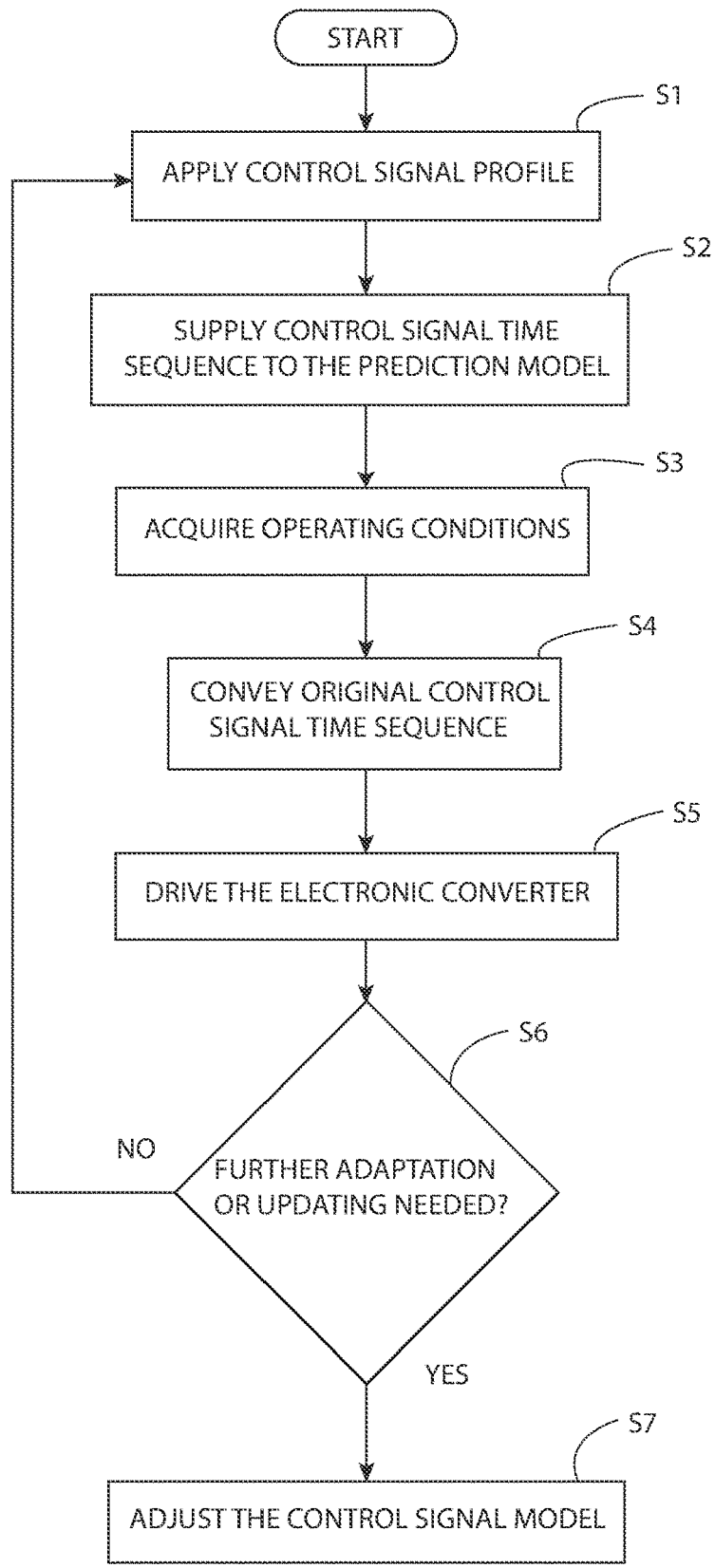
FIG. 4 shows a flow diagram to illustrate a method for operating the technical apparatus in the technical system of FIG. 1.

The control signal model can, in principle, be implemented in different variants. On the one hand, the control signal model can be implemented as hardware or software in the control unit 4 as part of the electronic system 1 or separately therefrom. Alternatively, in one variant, the control signal model can be implemented in the control unit 4 with an adaptation function in which the control signal model is accordingly retrained at predefined time points, or on a regular basis, in order to correct aging effects in the electronic system 1. An implementation of the last-named variant is described in more detail below with reference to a flow diagram of FIG. 4.

The method described there can be implemented in a control device 4 using hardware and/or software.

For this purpose, the control unit 4 of the electronic system 1 makes a control signal time sequence S available in step S1 as a control signal profile that is to be applied subsequently to the converter component 3. The provided control signal time sequence S is here parameterized by the control unit 4 or is provided as a state profile of an electrical variable (current or voltage). In the last-mentioned case, the parameterization can also take place in the control signal model block 5.

The provided control signal time sequence S can comprise individual current or voltage plateaus or can comprise control signal sequences of changing currents or voltages.

The provided control signal time sequence S is supplied in step S2 to the prediction model in order to ascertain a predicted control signal time sequence $S_{t+1} \ldots S_{t+T}$ from the control signal time sequence S acquired up to the current time point.

In step S3, operating conditions of the electronic converter 2 to be controlled and/or of the technical apparatus 6 as well as operating properties of the converter 2 and/or of the technical apparatus 6 and/or system properties of the converter 2 and/or of the technical apparatus 6 are acquired.

In step S4, the parameterized, original control signal time sequence S is conveyed to the data-based control signal model, in particular through continuously feeding the current value of the control signal (for storage in the control signal model block 5), and the parameterized, predicted control signal time sequence $S_{t+1} \ldots S_{t+T}$ is conveyed to the data-based control signal model, in particular together with operating conditions, the operating properties and/or the system properties.

The operating variables relate to the operation of the converter 2 or of the technical apparatus 6, and can comprise one or a plurality of the following variables: a voltage applied to the converter component 3, in particular to a transistor of the converter component 3, a current flowing at the current time point through the converter component 3, in particular through a transistor of the converter component 3 or through the technical apparatus 6, and a current temperature of the converter component 3 or of the technical apparatus 6. The operating properties can relate to general properties of the type of converter component 3 or of a transistor of the converter component 3 (transistor properties), of the converter 2 or of the technical apparatus 6 and relate to one or a plurality of the following parameters: threshold voltage, leakage current at the gate terminal, resistance in the on-state, along with their variances, that occur either due to scatters resulting from manufacturing tolerances or as a result of aging effects.

The system properties can furthermore relate to further components of the electronic circuit that can affect the operation of the electronic converter 2. The system properties can, for example, comprise one or a plurality of the following parameters of other system components of the electronic circuit: a thermal resistance of the system 1 that is decisive for the temperature of the electronic converter 2 to be controlled, the capacitance of a smoothing capacitor that is coupled to the electronic converter 2, and the like. Variances in the operating variables, in the operating properties and in the system properties that are the result either of the manufacturing tolerances or of aging can accordingly also be taken into consideration.

The control signal model ascertains from the corresponding input variables a modified control signal profile S' that can be used for operation of the electronic circuit 2, or of the corresponding modified control signal time sequence $S_{t+1} \ldots S_{t+T}$. This is provided in parameterized form.

In a subsequent step S5, the electronic converter 2 is driven in accordance therewith by the modified control signal profile S'. The conversion of the modified control signal parameters that define the modified control signal profile S' into the analog control signal S' can preferably take place in the control signal model block 5 or in an apparatus separate from that.

An adaptation criterion can be checked in step S6. If the adaptation criterion intends to perform a further adaptation or updating of the control signal model (alternative: yes), the method is continued in step S7, but otherwise (alternative: no) jumps back to step S1.

Adaptation criteria can, for example, depend on a predetermined time duration since the last adaptation, on the profile of the original control signal, or on an external adaptation signal. An updating of the control signal model can, furthermore, be initiated if system properties such as a temperature, voltage values, measurement signal and the like deviate from corresponding, predefined reference values by more than a predefined deviation magnitude. In particular, a check should be made through the adaptation criteria as to whether the control signal model needs to be retrained as a result of component aging, wear or other systematic changes in the operating conditions.

In step S7, the control signal model is adjusted by retraining or updating or training again.

The adjustment of the control signal model serves to correct inaccuracies in the circuit simulation and in the underlying component models in the control signal model if, for example as a result of component aging, wear or other systematic changes in the operating conditions, the control signal (adjustments) that have been learnt are no longer optimal.

The adjustment of the control signal model is aimed at generating modified control signal profiles from predefined control signal profiles in which the behavior measure is optimized. In particular, the cost function of the behavior measure and the equation system of the circuit simulation can be used in combination with a gradient descent method in order to train the model parameters of the control signal model further.

The initial creation of the control signal model can take place with a training data set consisting of a provided control signal profile S, a predicted control signal profile $S_{t+1} \ldots S_{t+T}$, and associated, modified control signals S'. The modified control signal profile is ascertained here, based in each case on a predefined control signal profile, and depending on a behavior measure that is determined from one or a plurality of behavior variables, which are determined for the modified control signal using a circuit simulation, and the predefined cost function.

Figure 5:
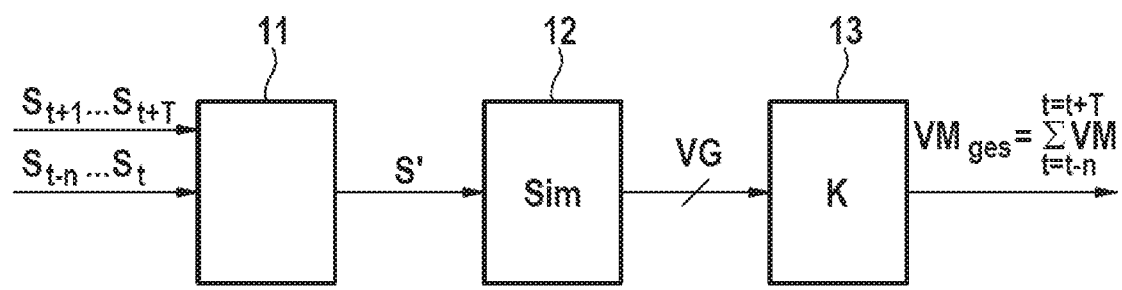
FIG. 5 shows a block diagram to illustrate a training of the control signal model.

A further approach to training the control signal model is described below with reference to the block diagram of FIG. 5. Block 11 represents the control signal model to be trained. This ascertains a predicted control signal profile $S_{t+1} \ldots S_{t+T}$ from the provided control signal profile $S_{t+1} \ldots S_{t+T}$, and a modified control signal profile S' according to the respectively current training state. A simulation block 12 serves to simulate one or a plurality of electrical behavior variables VG that simulates the operation of the technical apparatus 6 on the basis of the modified control signal profile S'. The simulation of electrical circuits is well known and is based on differential equations that are, as a rule, differentiable.

A cost function is specified in a cost function block 13 that combines the behavior variables VG for each time step under consideration of the modified control signal profile S' into a behavior measure VM. A total value of the behavior measure, in particular a sum of the behavior measures VM, then represents a total behavior measure $VM_{ges}$, which represents a loss for the training of the control signal model.

The training can take place through back-propagation, wherein differentiation is carried out by the simulation block and the control signal model in order to adapt the model parameters of the control signal model. It is necessary for this purpose that the applied cost function is also differentiable.

To construct the training data, control signal profiles with the greatest possible variety can be specified in the context of the possible control signals for operation of the converter component 3.

On the basis of the parameterization of the modified control signal profile S', the circuit simulations can ascertain the one or the plurality of corresponding behavior variables VG or the resultant behavior measure (depending on a predefined cost function).

Using an optimization method such as stochastic gradient descent, a training data set for the control signal model can be carried out by optimizing (minimizing) the total behavior measure $VM_{ges}$ with reference to a respective provided control signal profile S, in particular by back propagation. This is possible, because the functions underlying the circuit simulation and the cost function can be differentiated, so that the optimized behavior measure can be determined by differentiating the cost function and the function of the circuit simulation to update the model parameters of the control signal model.

The optimization can be performed with suitable auxiliary conditions so that the function effectuated by the control signal profile in the electronic system can also be achieved through the modified control signal profile S'. Alternatively or in addition, a parameter that evaluates how the function effectuated by the control signal profile is achieved by the modified control signal profile can also be taken into consideration in the cost function for calculating the behavior measure.

The control signal model can, in particular, be designed in the form of a neural network such as a recurrent neural network (LSTM, GRU), a multi-layer perceptron, or the like. The training of the control signal model can thus be carried out using a back-propagation method on the basis of a minimization of the total behavior measure $VM_{ges}$.

To lessen the load on the control unit 4 of the electronic system 1, the training or the adaptation of the control signal model can also be carried out externally of the electronic system 1. The parameterized original and modified control signal profiles S, S' as well as optionally the operating variables, the operating properties and the system properties can be transmitted for this purpose to an external computing unit that, knowing the electronic circuit, carries out the circuit simulations in order to calculate the behavior variables or the behavior measure. The retraining of the model parameters of the neural network can thus take place externally, and the model parameters transmitted back to the technical system 1, so that these can subsequently be applied.

In a further embodiment, the control signal model can also be implemented as a lookup table in the technical system, so that the control signal parameters of the original control signal profile are assigned to control signal parameters that are modified in accordance with the lookup table and represent the modified control signal profile S'. The lookup table is prepared here on the basis of a control signal model that can be implemented externally of the technical system 1. The computing effort in the electronic system 1 can be significantly reduced in this way.

What is claimed is:

1. A method for operating a technical apparatus having an electronic converter that is controlled by at least one control signal, the method comprising:
    providing a control signal profile of the at least one control signal to a control signal model block and a prediction block, the control signal profile suitable to operate a converter component of the electronic converter when the control signal profile is provided directly to the converter component;
    predicting a predicted control signal profile based on the provided control signal profile using the prediction block, the predicted control signal profile being a predicted future profile of the at least one control signal;
    providing the predicted control signal profile to the control signal model block;
    obtaining a modified control signal profile of the at least one control signal by modifying the provided control signal profile using a trainable, data-based control signal model of the control signal model block, the trainable, data-based control signal model being trained to determine the modified control signal profile based on the provided control signal profile and the predicted control signal profile; and
    providing the modified control signal profile of the at least one control signal directly to the converter component of the electronic converter in order to operate the electronic converter using the modified control signal profile.

2. The method as claimed in claim 1, wherein the trainable, data-based control signal model is configured to determine the modified control signal profile based on at least one of:
    at least one operating variable of at least one of the electronic converter and the technical apparatus, the at least one operating variable affecting an operation of the technical apparatus, the at least one operating variable comprising at least one of (i) a thermal resistance of an overall construction, (ii) a variance of the thermal resistance, (iii) a capacitance of a smoothing capacitor that is coupled to an electronic component, and (iv) a variance of the capacitance;
    at least one operating property of at least one of the electronic converter and the technical apparatus;
    at least one system property of at least one of the electronic converter and the technical apparatus; and
    at least one system variable of the technical apparatus.

3. The method as claimed in claim 1, wherein the trainable, data-based control signal model is configured as a trainable, data-based artificial neural network.

4. The method as claimed in claim 3, wherein the trainable, data-based artificial neural network is one of a multilayer perceptron and a recursive neural network.

5. The method as claimed in claim 1, wherein at least one of:
the provided control signal profile is one of parameterized and defined for operating the electronic converter;
the predicted control signal profile is one of parameterized and defined by control signal parameters; and
the modified control signal profile is one of parameterized and defined by modified control signal parameters.

6. The method as claimed in claim 5 further comprising:
parameterizing at least one of the provided control signal profile and the modified control signal profile with time segments and one of (i) voltage values assigned to the time segments and (ii) current values assigned to the time segments.

7. The method as claimed in claim 5 further comprising:
parameterizing at least one of the provided control signal profile and the modified control signal profile with at least one parameter of a periodic actuation, the at least one parameter including at least one of (i) a cycle frequency of a frequency modulation, (ii) a cycle frequency of a pulse-width modulation, (iii) a modulation depth, (iv) a duty ratio, (v) a pulse duration, and (vi) a pulse shape.

8. The method as claimed in claim 1, the predicting the predicted control signal profile further comprising:
predicting the predicted control signal profile using a data-based prediction model that is trained to ascertain the predicted control signal profile based on the provided control signal profile, the data-based prediction model being one of (i) a recurrent neural network, (ii) a state-space model, (iii) a Sequence2Sequence model and (ii) a NARXGP model.

9. The method as claimed in claim 1, the obtaining the modified control signal profile further comprising:
modifying the provided control signal profile using the trainable, data-based control signal model based on (i) the provided control signal profile, (ii) the predicted control signal profile, and (iii) at least one operating variable of the technical apparatus that indicates a state of the technical apparatus to be controlled depending on the predicted control signal profile.

10. The method as claimed in claim 1, wherein a device is configured to carry out the (i) providing the control signal profile, (ii) the predicting the predicted control signal profile, (iii) the obtaining the modified control signal profile, and (iv) the operating the electronic converter.

11. The method as claimed in claim 1, wherein a computer executes commands of a computer program to carry out the method.

12. The method as claimed in claim 11, wherein the computer program is stored on a non-transitory machine-readable storage medium.

13. The method as claimed in claim 1, wherein the modified control signal profile is provided directly to a base or a gate of the converter component.

14. A method for training a control signal model that determines, based on a provided control signal profile and a predicted control signal profile, a modified control signal profile for operating an electronic converter of a technical apparatus, the method comprising:

providing training data sets that each comprise (i) the provided control signal profile with which the electronic converter is to be operated and (ii) the predicted control signal profile; and
training the control signal model depending on a loss function, such that the provided control signal profile and the predicted control signal profile are mapped onto the modified control signal profile,
wherein the provided control signal profile is suitable to operate a converter component of the electronic converter when the control signal profile is provided directly to the converter component,
wherein the modified control signal profile is provided directly to the converter component for operating the electronic converter, and
wherein the loss function depends on at least one behavior measure of the technical apparatus when operating the electronic converter with the modified control signal profile.

15. The method as claimed in claim 14, wherein the at least one behavior measure characterizes a property of the technical apparatus depending on at least one behavior variable that indicates a behavior of an electronic circuit of the technical apparatus depending on the modified control signal profile, the method further comprising:
determining the at least one behavior measure according to a predefined cost function that is configured to evaluate behavior variables.

16. The method as claimed in claim 15 further comprising:
ascertaining the at least one behavior variable using at least one of (i) a measurement and (ii) a circuit simulation.

17. The method as claimed in claim 15, wherein the predefined cost function maps a plurality of behavior variables onto the at least one behavior measure and is differentiable, the training further comprising:
training the control signal model using a gradient-based training process and depending on the loss function.

18. The method as claimed in claim 15, wherein the at least one behavior variable indicates a performance capability of the technical apparatus when driven by the modified control signal profile, the at least one behavior variable indicating at least one of (i) a power loss, (ii) a measure of disturbance, (iii) a measure relating to an occurrence of oscillations, (iv) a measure relating to an occurrence of overshoots, (v) a thermal stress on the technical apparatus, (vi) a measure of stress affecting a service life of the converter component of the electronic converter, and (vii) a measure of stress affecting a service life of the technical apparatus.

19. The method as claimed in claim 14, wherein a device is configured to carry out the (i) providing the training data sets and (ii) the training the control signal model.

20. An electronic system comprising:
a technical apparatus having a converter component of an electronic converter, the electronic converter controllable by at least one control signal, the at least one control signal having a control signal profile that is suitable to operate the converter component when the control signal profile is provided directly to the converter component; and
a device configured to (i) provide the control signal profile of the at least one control signal to a control signal model block and a prediction block of the device, (ii) predict a predicted control signal profile based on the provided control signal profile using the prediction block, the predicted control signal profile being a predicted future profile of the at least one control signal, (iii) provide the predicted control signal profile to the control signal model block, (iv) obtain a modified control signal profile of the at least one control signal by modifying the provided control signal profile using a trainable, data-based control signal model of the control signal model block, the trainable, data-based control signal model being trained to determine the modified control signal profile based on the provided control signal profile and the predicted control signal profile, and (v) operate the electronic converter using the modified control signal profile by providing the modified control signal profile of the at least one control signal, directly to the converter component in order to operate the electronic converter using the modified control signal profile.

\* \* \* \* \*